United States Patent
Liu et al.

(10) Patent No.: US 10,115,592 B2
(45) Date of Patent: Oct. 30, 2018

(54) PATTERNING PROCESS WITH SILICON MASK LAYER

(71) Applicant: Taiwan Semiconductor Manufacturing Co., Ltd., Hsinchu (TW)

(72) Inventors: Chen-Yu Liu, Kaohsiung (TW); Ching-Yu Chang, Yilang County (TW); Chin-Hsiang Lin, Hsin-chu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/595,525

(22) Filed: May 15, 2017

(65) Prior Publication Data
US 2018/0174828 A1    Jun. 21, 2018

Related U.S. Application Data

(60) Provisional application No. 62/434,977, filed on Dec. 15, 2016.

(51) Int. Cl.
| | |
|---|---|
| H01L 21/33 | (2006.01) |
| H01L 21/027 | (2006.01) |
| H01L 21/311 | (2006.01) |

(52) U.S. Cl.
CPC ...... H01L 21/0274 (2013.01); H01L 21/0272 (2013.01); H01L 21/31133 (2013.01)

(58) Field of Classification Search
CPC .......... H01L 21/31133; H01L 21/0272; H01L 21/0274
See application file for complete search history.

(56) References Cited

U.S. PATENT DOCUMENTS

| | | | |
|---|---|---|---|
| 8,796,666 | B1 | 8/2014 | Huang et al. |
| 9,012,132 | B2 | 4/2015 | Chang |
| 9,093,530 | B2 | 4/2015 | Huang et al. |
| 9,028,915 | B2 | 5/2015 | Chang et al. |
| 9,146,469 | B2 | 9/2015 | Liu et al. |
| 9,213,234 | B2 | 12/2015 | Chang |
| 9,223,220 | B2 | 12/2015 | Chang |
| 9,256,133 | B2 | 2/2016 | Chang |
| 9,536,759 | B2 | 1/2017 | Yang et al. |
| 9,548,303 | B2 | 1/2017 | Lee et al. |
| 2011/0033803 | A1* | 2/2011 | Hatakeyama ......... G03F 7/0035 430/285.1 |
| 2014/0145311 | A1* | 5/2014 | Olson ..................... H01L 23/52 257/622 |

* cited by examiner

*Primary Examiner* — Elias M Ullah
(74) *Attorney, Agent, or Firm* — Haynes and Boone, LLP (57) ABSTRACT

A lithography method is provided in accordance with some embodiments. The lithography method includes forming an under layer on a substrate; forming a silicon-containing middle layer on the under layer, wherein the silicon-containing middle layer has a thermal base generator (TBG) composite; forming a photosensitive layer on the silicon-containing middle layer; performing an exposing process to the photosensitive layer; and developing the photosensitive layer, thereby forming a patterned photosensitive layer.

20 Claims, 7 Drawing Sheets

PATTERNING PROCESS WITH SILICON MASK LAYER

PRIORITY

This application claims the benefit of U.S. Prov. App. No. 62/434,977 entitled "Patterning Process with Silicon Mask Layer," filed Dec. 15, 2016, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

A patterned photoresist layer is commonly used to transfer a designed pattern having small feature sizes from a photomask to a wafer. The photoresist is light-sensitive and can be patterned by a photolithography process. Furthermore, the photoresist layer provides resistance to etch or ion implantation, which further requires a sufficient thickness. When IC technologies are continually progressing to smaller feature sizes, the thickness is not scaled down accordingly due to the resistance requirement. Depth of focus sufficiently enough to cover the thicker photoresist will degrade the imaging resolution. For example, a tri-layer resist is introduced to overcome the above challenge. However, due to various requirements, such as optical refractivity index and absorption, the tri-layer resist may be tuned to meet those requirements but does not have enough etch selectivity for patterning. Therefore, there is a need for a tri-layer resist material and a lithography method to address the above issue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 through 8 provide sectional views of a semiconductor structure 100 at various fabrication stages in accordance with some embodiments. The semiconductor structure 100 and the method making the same are collectively described with reference to FIGS. 1-13.

Figure 1:
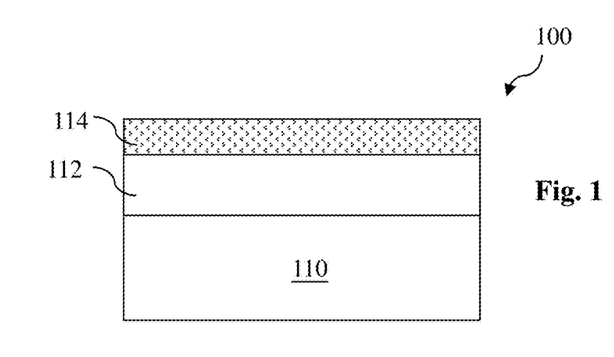
FIGS. 1, 2, 3, 4, 5, 6, 7, and 8 are sectional views of one exemplary semiconductor structure at various fabrication stages, constructed in accordance with some embodiments.

Referring to FIG. 1, the semiconductor structure 100 is a semiconductor wafer in the present embodiment. The semiconductor structure 100 includes a semiconductor substrate 110, such as a silicon substrate in some embodiments. The substrate 110 may include another elementary semiconductor, such as germanium, or diamond in some embodiments. The substrate 110 may include a compound semiconductor, such as silicon carbide, gallium arsenic, indium arsenide, and indium phosphide. The substrate 110 may include an alloy semiconductor, such as silicon germanium, silicon germanium carbide, gallium arsenic phosphide, and gallium indium phosphide. The substrate 110 may include one or more epitaxial semiconductor layer, such as semiconductor layer(s) epitaxially grown on a silicon substrate. For example, the substrate may have an epitaxial layer overlying a bulk semiconductor. Further, the substrate may be strained for performance enhancement. For example, the epitaxial layer may include semiconductor materials different from those of the bulk semiconductor such as a layer of silicon germanium overlying a bulk silicon, or a layer of silicon overlying a bulk silicon germanium formed by a process including selective epitaxial growth (SEG). Furthermore, the substrate 110 may include a semiconductor-on-insulator (SOI) structure. For examples, the substrate may include a buried oxide (BOX) layer formed by a process such as separation by implanted oxygen (SIMOX). In other embodiments, the substrate 110 may include a glass such as in thin film transistor (TFT) technologies.

The semiconductor structure 100 may also include other material layers and other circuit patterns. For example, the semiconductor structure 100 includes various doped features, such as doped well structure (e.g., a P-typed doped well and an N-type doped well) formed in the semiconductor substrate 110. In other embodiments, the semiconductor structure 100 may further include one or more material layers to be patterned (by etching to remove or ion implantation to introduce dopants), such as a dielectric layer to be patterned to form trenches for conductive lines or holes for contacts or vias; a gate material stack to be patterned to form gates; or a semiconductor material to be patterned to form isolation trenches. For example, a material layer to be patterned is a semiconductor layer as a part of the semiconductor substrate 110. In other embodiments, multiple semiconductor material layers, such as gallium arsenic (GaAs) and aluminum gallium arsenic (AlGaAs), are epitaxially grown on the semiconductor substrate and are patterned to form various devices, such as light-emitting diodes (LEDs). In some other embodiments, the semiconductor structure 100 includes fin active regions and three dimensional fin field-effect transistors (FinFETs) formed or to be formed thereon.

Still referring to FIG. 1, an under layer 112 is formed on the semiconductor substrate 110. The under layer 112 is the first layer of a tri-layer resist. In some cases, the under layer 112 may be referred to as a bottom-material layer. The under layer 112 functions as a mask to protect the substrate 110 from etching or ion implantation. Accordingly, the under layer 112 has a sufficient thickness to achieve this. In some embodiments, the under layer 112 includes organic polymers free of silicon. In one example, the under layer 112 comprises a Spin-On Carbon (SOC) material. In one example, the under layer 112 comprises a novalac resin. The formation of the under layer 112 may include spin-on coating and baking process.

Still referring to FIG. 1, a middle layer 114 is formed on the under layer 112. The middle layer 114 is the second layer of the tri-layer resist. The middle layer 114 is a silicon-containing layer designed to provide etch selectivity from the under layer 112. In the present embodiment, the middle layer 114 functions as an etch mask to transfer a pattern to the under layer 112. In some embodiments, the middle layer 114 is also designed to function as a bottom anti-reflective coating that reduces reflection during a lithography exposure process, thereby increasing the imaging contrast and enhancing the imaging resolution. The silicon-containing middle layer 114 and the typically carbon-rich under layer 112 are designed to have etch selectivity. In some embodiments, the formation of the middle layer 114 includes spin-on coating and baking process.

Particularly, a middle layer may have carbon-containing composites and have silicon content less than 40% in weight percentage. It is desirable to increase silicon concentration in the middle layer 114 to therefore improve etch selectivity to the under layer 112. In many cases, additives in a middle layer have high carbon concentration. These carbon-rich additives reduce average silicon concentration in a middle layer. The disclosed method and the middle layer 114 are designed such that the carbon-rich additives can be effectively removed from the middle layer 114 by a thermal treatment. Furthermore, cross-linking reaction among silicon-containing monomers in the middle layer 114 is enhanced, resulting in more efficient cross-linking monomers. Accordingly, the middle layer 114 has higher density and etch selectivity. In some embodiments, the middle layer 114 has more than 45% silicon in weight percentage.

The middle layer 114 is formed by first creating a solution that includes a solvent and a variety of silicon-based monomers. A monomer is a molecule that is capable of chemically bonding with other monomers to form a polymer. Such polymers form the silicon-based resin. The solution can be referred to as a monomer solution or a resin solution. The polymerization causes some of the monomers to cross-link such that the molecular weight increases on average. The resin solution thus includes the solvent, the polymers, and remaining monomers. According to principles described herein, the nature of the resin solution are such that a majority of monomers do not have cross-links occur and instead have cross-links occur during further treatment that will be described in further detail below.

The solvent used for the monomer solution may be any appropriate solvent. For example, the solvent may include an alcohol type solvent, such as Propylene Glycol Methyl Ether (PGME), isopropyl alcohol, or n-butanol. In some embodiments, the solvent is an organic solvent. In some embodiments, an aqueous co-solvent and organic solvent is used. In furtherance of some embodiments, the solvent includes water that is less than 20 percent of the total solvent in volume. In some embodiments, the solvent has a boiling temperature less than 200 degree Celsius.

Figures 9, 10:
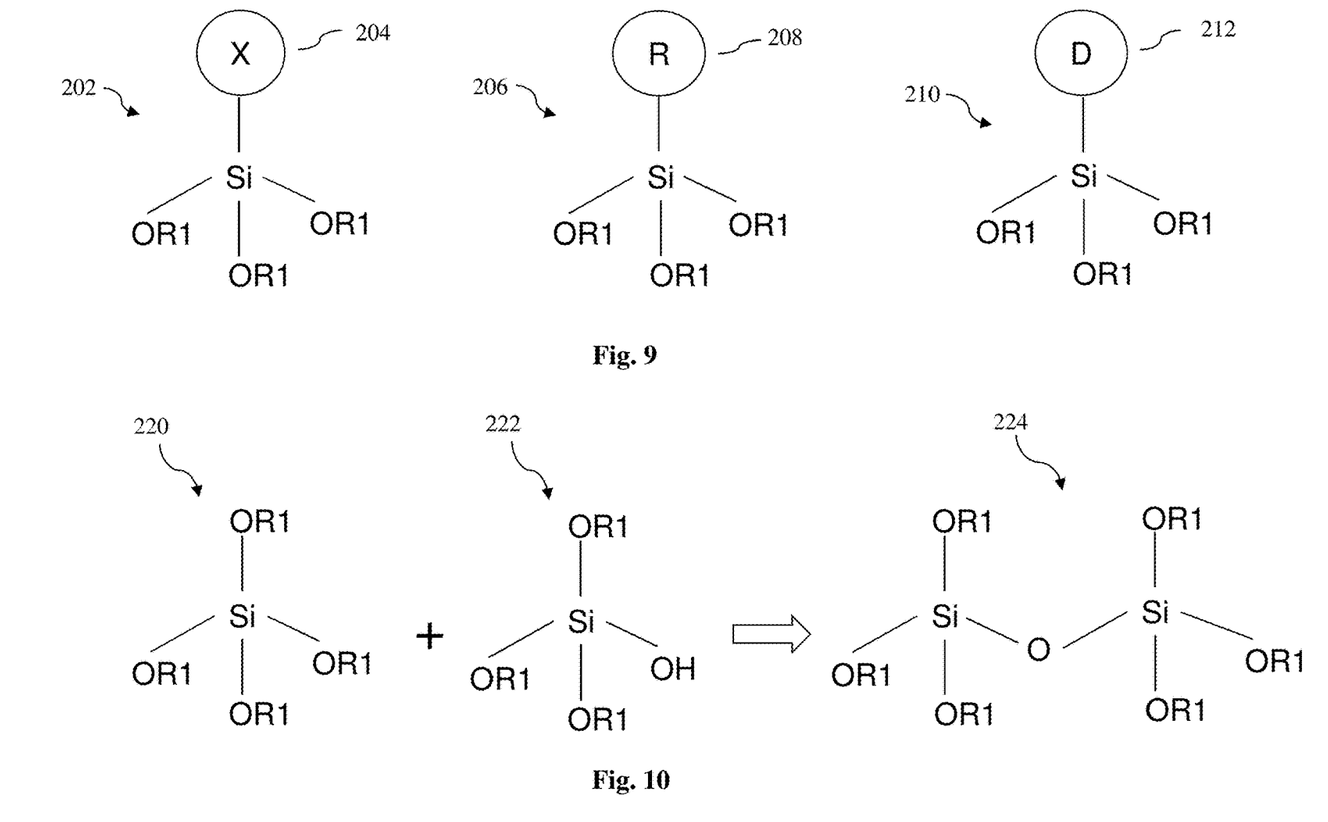
FIG. 9 is a diagram showing illustrative monomers that may be used to form a polymer resin used for a middle layer, according to aspects of the present disclosure in some embodiments.
FIG. 10 is a diagram showing an illustrative chemical reaction between two monomers to create a polymer, according to aspects of the present disclosure in some embodiments.

FIG. 9 is a diagram showing illustrative monomers that may be used to form the polymer resin used for the middle layer 114. A first silicon-based monomer 202 includes functional groups on all four sides, which are able to be cross-linked with another monomer or polymer. Specifically, three sides of monomer 202 include a functional group $OR_1$, where O is oxygen. The $R_1$ may represent a variety of other elements or molecules including but not limited to hydrogen, methyl, or ethyl. The functional group $OR_1$ is able to be cross-linked with another monomer or polymer. The monomer 202 further includes an organic group 204 (labeled as "X") that provide crosslinking sites in its fourth side.

In some embodiments, the organic group 204 ("X") is a cross-linker, which is an alkyl group having 2-20 carbons ($C_2$-$C_{20}$) with at least one crosslinkable functional group, such as —I, —Br, —Cl, —$NH_2$, —COOH, —OH, —SH, —$N_3$, epoxy, alkyne, alkene, ketone, aldehyde, ester, acyl halide, NHS ester, Imidoester, pentafluorophenyl ester, Hydroxymethyl phosphine, Carbodiimide, Maleimide, Haloacetyl, Pyridyldisulfide, Thiosulfonate, Vinylsulfone, Hydrazide, Alkoxyamine, Diazirine, Aryl azide, Isocyanate, Phosphine, Amide, ether, or a combination thereof. It is preferred the organic group 204 ("X") has short site chains to reduce carbon concentration. In the present embodiment, the organic group 204 ("X") is identical to the functional group $OR_1$. Thereby the monomer 202 includes the functional group $OR_1$ on all four sides in the present embodiment. Thus, at four locations, the monomer 204 is able to cross-link with other monomers and/or polymers.

A second silicon-based monomer 206 includes an organic group 208 (labeled as "R") that enhances the adhesion of the photosensitive layer but is not able to be cross-linked. The remaining sides include the functional group $OR_1$, which is able to be cross-linked. Thus, at three locations ($OR_1$), the monomer 206 is able to be cross-linked with other monomers and/or polymers.

In some embodiments, the organic group 208 ("R") includes an alkyl group having 1-20 carbons ($C_1$-$C_{20}$) with a non-cyclic structure or a cyclic structure. For example, the cyclic structure is an aromatic ring. The organic group 208 ("R") is designed to enhance photoresist adhesion, etching resistance, and wet strippability. In other examples, the alkyl group further includes a functionalized group, such as —I, —Br, —Cl, —NH$_2$, —COOH, —OH, —SH, —N$_3$, —S(=O)—, alkene, alkyne, imine, ether, ester, aldehyde, ketone, amide, sulfone, acetic acid, cyanide, or a combination thereof. In the present embodiment, the organic group 208 ("R") is methyl or ethyl.

A third silicon-based monomer 210 includes an aromatic group 212 (labeled as "D") that modifies the characteristics (such as refractive index n, extinction coefficient κ and/or etch resistance) of the middle layer 114 but is not able to be cross-linked. The remaining sides include the functional group OR$_1$, which is able to form be cross-linked. Thus, at three locations (OR$_1$), the monomer 210 is able to be cross-linked with other monomers and/or polymers.

In some embodiments, the aromatic group ("D") 212 includes a chromophore and includes an alkyl group having 3-20 carbons ($C_3$-$C_{20}$) with at least one light-sensitive functional group, such as aromatic groups or heterocyclic groups. The aromatic structures can be phenyl, napthlenyl, phenanthrenyl, anthracenyl, phenalenyl, or other aromatic derivatives containing one to five-membered rings. In the present embodiment, the aromatic group 212 ("D") is a phenyl.

In some embodiments, the resin solution includes all above three monomers, or a combination thereof, in certain percentage respectively. As an example, the ratio of monomer 202 to the total number of monomers in the resin solution is larger than 30%, the ratio of monomer 206 is less than 50%, and the ratio of monomer 210 is less than 20%. It is desirable to have more cross-linking reactions when the middle layer 104 is formed in order to cause higher silicon concentration and higher material density due to resin shrinkage. Thus, the resin solution may include more monomers like monomer 202 that can form cross-links on all four sides. In some embodiments, the ratio of monomers like monomer 202 that can be cross-linked on all four sides to the total number of monomers in the resin solution is greater than 40%. In the present embodiment, the ratio of monomers like monomer 202 to the total number of monomers in the resin solution is about 70%, the ratio of monomers like monomer 206 is about 20%, and the ratio of monomers like monomer 210 is about 10%.

The monomers 202, 206, and 210 that can be used in the resin solution can be combined to form polymers that form the silicon-based resin by cross-linking reaction. Such polymers may be referred to as siloxane polymer because they include silicon-oxygen bonds. Siloxane polymer can form the backbone of silicon-based resins that are used to form the middle layer.

As an example for the above cross-linking reaction, FIG. 10 shows an illustrative chemical reaction between two monomers 220 and 222 to create a polymer 224. Monomer 220 can be cross-linked on all four sides because the functional group on each side is OR$_1$. The constituent OR$_1$ group in some monomers may hydrolyze in the resin solution, resulting in monomer 222 where a hydroxyl group is formed in place of an OR$_1$ group. Monomers 220 and 222 may then react to form a cross-linked structure such as the polymer 224. The polymer 224 has six locations at which a cross-linking reaction can occur. Thus, more monomers can be added to the polymer 224 to increase the size of the polymer and the molecular weight. In various examples, the hydrolysis and cross-linking described above will continue with some monomers and form siloxane polymers with molecular weight ranging from about 1000 g/mol to about 8000 g/mol. A siloxane polymer 230 with its chemical structure is schematically illustrated in FIG. 11 in accordance with some embodiments.

Figure 11:
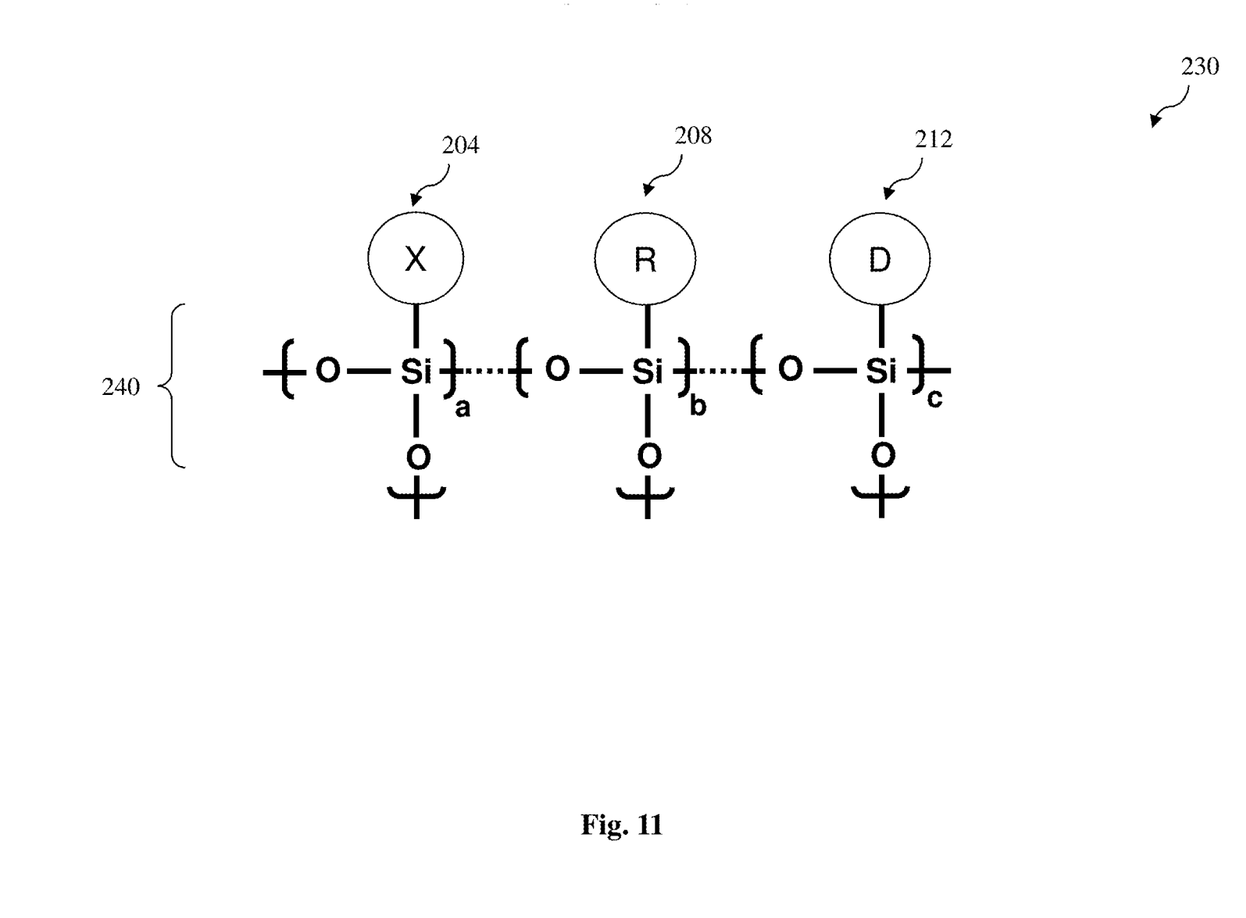
FIG. 11 is a diagrammatical view of a chemical structure in a middle layer used in a photolithography process, according to aspects of the present disclosure in some embodiments.

Still referring to FIG. 11, the chemical structure of the siloxane polymer 230 includes a backbone 240 having a plurality of O—Si—O groups chemically bonded together. In some embodiments, the O—Si—O groups may not be directly bonded together. For example, some carbon spacers free of silicon may bridge two adjacent O—Si—O groups and bond the two adjacent O—Si—O groups together. In some embodiments, carbon spacers can be a simple alkyl group or an acid-cleavable group, such as aromatic rings, aliphatic groups, heterocyclic rings, —C(=O)—, —C(=NR)—, —SO$_2$, —S(=O)—, —COOR, —CONHR, —CONR$_2$, ethers, alkenes, or alkynes. The siloxane polymer 230 further includes functional groups "X", "R", and "D" as described above.

The backbone 240 of the siloxane polymer 230 includes a first subset bonded to the organic groups 204 that provide crosslinking sites, a second subset bonded to the organic groups 208 that enhance the adhesion of the photosensitive layer, and a third subset bonded to the aromatic groups 212 that modify refractive index n, extinction coefficient κ and/or etch resistance, as illustrated in FIG. 11. Relative weight percentages of the first, second and third subsets of the O—Si—O groups are "a", "b", and "c", respectively (as labeled in FIG. 11). The sum a, b and c is 1 or 100%. The relative weight percentages a, b, and c are adjusted such that various parameters are properly tuned. The weight percentage "a" ranges from 0.3 to 1 in accordance with some embodiments. For example, when more crosslinking sites are expected, the weight percentage "a" of the first subset of the O—Si—O groups is increased. The weight percentage "b" ranges from 0 to 0.5 in accordance with some embodiments. To be noted, the chemical group "D" is carbon-rich, which reduces the average silicon weight percentage of siloxane polymer 230. The weight percentage "c" ranges from 0 to 0.2 in accordance with some embodiments. To further increase the silicon content of the middle layer 114, in furtherance of some embodiments, the weight percentage "c" of the third subset of the O—Si—O groups is zero. In the present embodiment, a, b, and c are about 0.7, 0.2, and 0.1, respectively.

Figure 12:
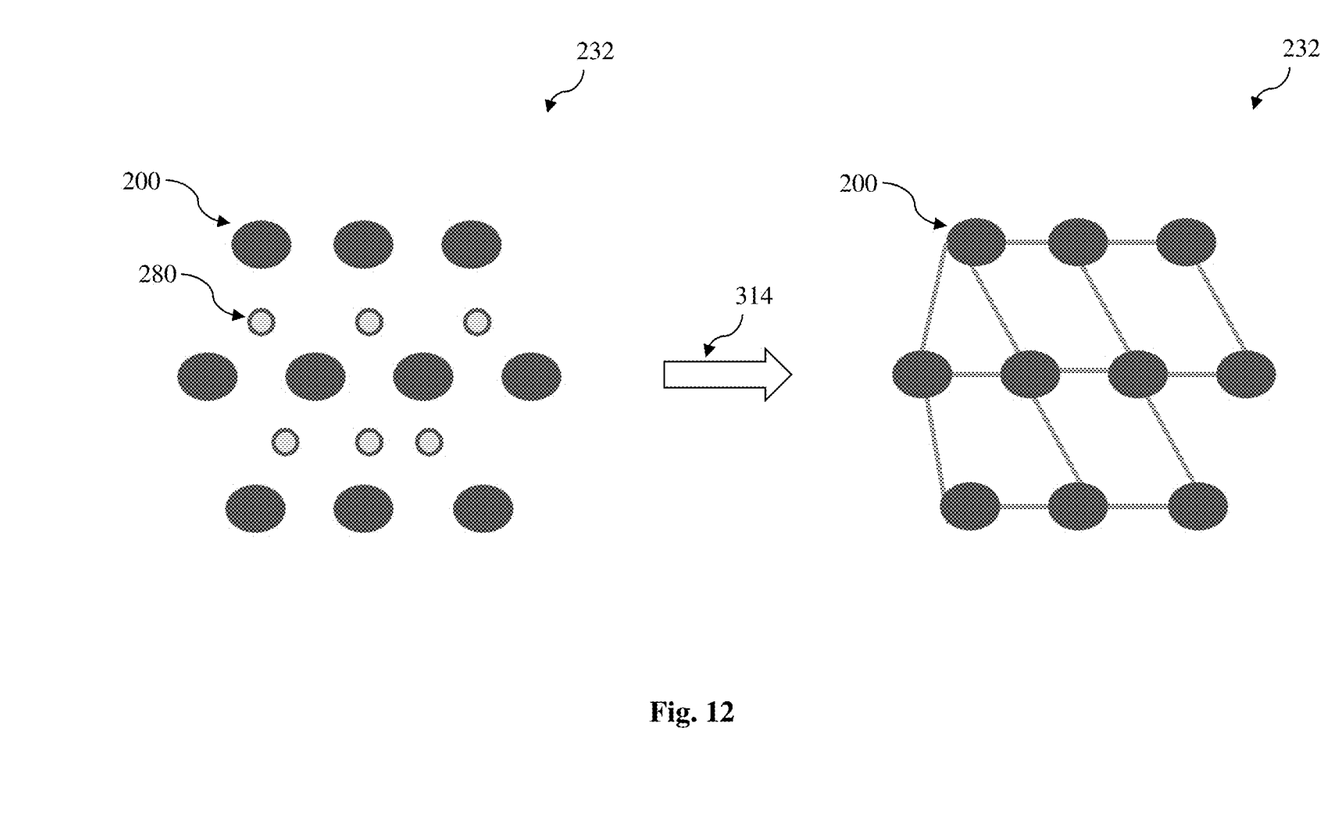
FIG. 12 is a diagram showing cross-link formation among monomers in a middle layer during a thermal treatment, according to aspects of the present disclosure in some embodiments.

Referring to FIG. 12, thermal base generator (TBG) additive 280 is added in the resin solution 232 to increase cross-linking reaction rate among monomers 200. According to principles described herein, it is desired that cross-linking reaction among silicon-containing monomers is enhanced to more efficiently cross-link monomers. This helps the middle layer 114 to have greater silicon concentration and greater etching selectivity. Since monomers 202, 206, and 210 (FIG. 9) each has at least three sites that provide cross-linking capability, it provides opportunity to form siloxane polymer with O—Si—O groups more in net meshing than in chain topology.

Still referring to FIG. 12, the resin solution 232 includes monomers 200, polymers, TBG additive 280, and solvent as well. Before a heat treatment 314 is applied, the monomers 200 are not fully cross-linked and majority of linking sites are available for further cross-linking. The resin solution is then applied to the wafer, particularly on the top surface of the under layer of the tri-layer resist. In some embodiments, the resin solution 232 is applied using a spin-on coating process. For such a process, the resin solution is applied while the wafer spins on a wafer stage. The spin speed may be within a range of 800 rpm to 2500 rpm (e.g., 1500 rpm). After the spin-on coating process, a thermal treatment is applied to the resin solution. The thermal treatment can be a baking process, a UV curing, or other appropriate methods. In the present embodiment, a baking process is applied to the middle layer 114 in order to decompose the TBG additive 280 to release a base and cause additional cross-linking reactions to occur.

The baking process causes the TBG additive 280 to decompose and release base. Silicon-containing monomers 200 become unstable in a base environment and constituent Si—$OR_1$ component may readily hydrolyze and becomes Si—OH. Base further snatches hydrogen from Si—OH component. Si—OH component becomes Si—$O^-$ after losing a hydrogen, which is more active in replacing other monomer's bonding between $OR_1$ group and Si, resulting in a Si—O—Si bond to connect two monomers. The four cross-linking sites provided by the monomer 202 and three cross-linking sites provided by the monomers 206, 210 are thereby more sufficiently cross-linked with other monomers after TBG additive 280 releases its base. Thus, the polymers within the resin solution are further cross-linked to form the resin with the molecular weight greater than the molecular weight of the resin solution before the baking process. In some embodiments, the molecular weight of the resin solution before the baking process is less than 5000 g/mol (e.g., around 2000 g/mol) and the molecular weight of the resin after the baking process is greater than 10,000 g/mol.

Figure 13:
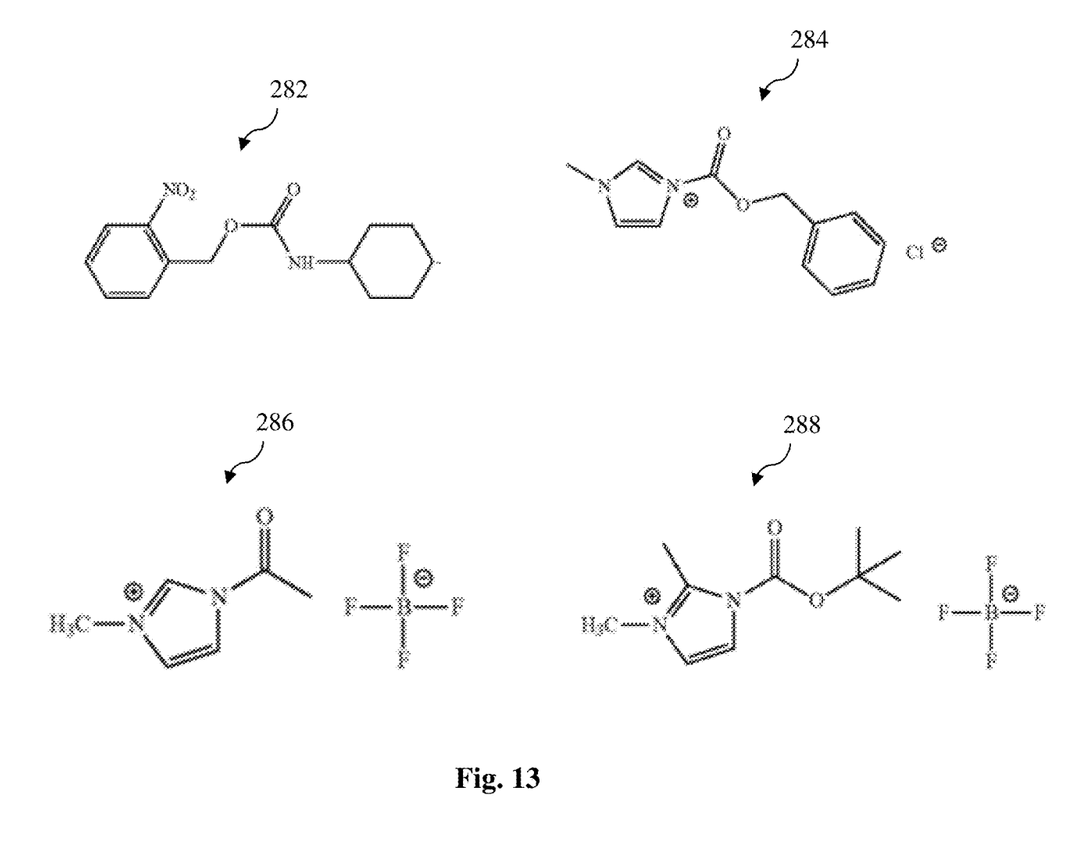
FIG. 13 is a diagrammatical view of chemical structures of exemplary thermal base generators, according to aspects of the present disclosure in some embodiments.

Typically TBG additive is a carbon rich chemical. Residuals of TBG additive after decomposition remain in the resin solution, which lower average silicon weight percentage in the middle layer 114. According to principles described herein, it is desirable that the residuals of TBG additive would be driven out from the middle layer 114 during thermal treatment to further increase silicon concentration, thus to achieve an improved etch selectivity. In some embodiments, TBG additive 280 with molecular weight less than 300 g/mol is added in the resin solution, such as chemical 282, 284, 286, and 288, or a combination thereof, as illustrated in FIG. 13. TBG additives with small molecular weight are easier to evaporate during thermal treatment. In furtherance of some embodiments, TBG additive 280 with molecular weight less than 200 g/mol, such as chemical 286, is selected. In some embodiments, the weight percentage of TBG additive 280 in the resin solution is 10% or less. In some other embodiments, the weight percentage of TBG additive 280 in the resin solution is 5% to 15%.

In some embodiments, the thermal treatment is a baking process including heating the resin solution to a temperature within a range of 150 degree Celsius to 300 degree Celsius. The baking duration may be 20 seconds to 120 seconds. In furtherance of the embodiments, the resin solution may be baked at about 220 degree Celsius for about 60 seconds. During the baking process, TBG additive is decomposed and releases base to accelerate cross-linking actions of monomers. The TBG residuals after decomposition is slowly driven out by the heat and evaporate from the surface of the middle layer 114.

Additionally, the baking process may include two heating steps. In the first heating step, the resin solution is heated to a first temperature above the threshold temperature of TBG additive decomposition, but below a boiling temperature of TBG decomposed residuals. In some embodiments, the first temperature is within a range of 100 degree Celsius to 215 degree Celsius for duration of 20 seconds to 120 seconds (e.g, 60 seconds). TBG additive 280 is decomposed and releases base during the first heating step. In one example, the first temperature is below the solvent boiling temperature as well. In the second heating step, the resin solution is heated to a second temperature above the boiling temperature of TBG decomposed residuals. In some embodiments, the second temperature is within a range of 150 degree Celsius to 300 degree Celsius for duration of 20 seconds to 120 seconds (e.g., 60 seconds). In some embodiments, the second heating step has longer duration than the first heating step. In some embodiments, the second heating step has the same duration as the first heating step, in a range of 60 seconds to 90 seconds. TBG decomposed residuals evaporate under the second temperature and leave the middle layer 114. The second temperature is higher than the first temperature. In some embodiments, the second temperature is higher than solvent boiling point as well. More solvent is removed during the second heating step. Because there is additional solvent removed during this process, more shrinkage occurs in the middle layer. In some embodiments, the middle layer 114 shrinks around 20% in volume after the baking process. In some embodiments, the middle layer 114 is substantially free of TBG residuals after the baking process.

In some embodiments, the baking process is in-situ with the spin-on coating process. The heating element is equipped in the spin-on coating apparatus, thereby without a need of transferring wafers. In some embodiments, the baking process is by using a separate baking apparatus, such as a baking oven.

Figure 2:
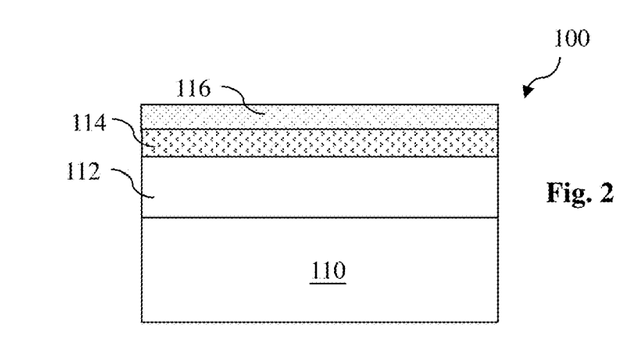

Referring to FIG. 2, a photosensitive layer (photoresist layer or resist layer) 116 is formed on the middle layer 114. The photosensitive layer 116 is the top layer of the tri-layer resist. The formation of the photosensitive layer 116 may include spin-on coating and baking process. The photosensitive layer 116 may include a photosensitive chemical, a polymeric material and a solvent. In some embodiments, the photosensitive layer 116 utilizes a chemical amplification (CA) resist material. For example, a positive CA resist material includes a polymer material that turns soluble to a developer such as a base solution after the polymeric material is reacted with acid. Alternatively, the CA resist material can be negative and include a polymer material that turns insoluble to a developer such as a base solution after the polymer is reacted with acid. The photosensitive layer 116 further includes a solvent. The solvent may be partially evaporated by a soft baking process. In furtherance of the embodiments when the CA resist material is used, the photosensitive chemical includes photo-acid generator (PAG) distributed in the photosensitive layer. When absorbing photo energy, the PAG decomposes and forms a small amount of acid. The PAG may have a concentration ranging between about 1% and 30% weight of the photosensitive layer 116.

Other components, such as a quencher distributed in the solvent and polymeric material may be additionally included in the photosensitive layer 116. In the present example, the quencher is base type and is capable of neutralizing acid. Collectively or alternatively, the quencher may inhibit other active components of the photosensitive layer 116, such as inhibiting photo acid from reaction.

Figure 3:
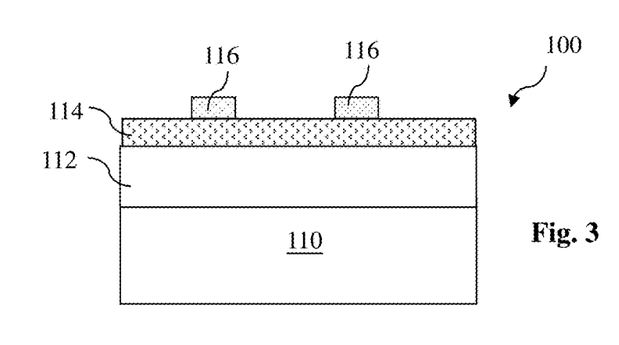

Referring to FIG. 3, the photosensitive layer 116 is patterned by a suitable lithography process. In some embodiments, the lithography process is a photolithography process utilizing proper radiation source and corresponding radiation energy. The photosensitive layer 116 is exposed to a radiation energy through a photomask (mask or reticle)

having a predefined pattern. In various examples, the radiation energy may include a 248 nm beam by Krypton Fluoride (KrF) excimer lasers, a 193 nm beam by Argon Fluoride (ArF) excimer lasers, a 157 nm beam by Fluoride Excimer Lasers, or Extreme ultra-violet (EUV) light, such as EUV light with wavelength at about 13.5 nm. After the exposure, the photoresist layer 116 is developed by a developer to form a patterned photosensitive layer. In the present example, the photosensitive layer 116 has positive-tone, and exposed portions of the photosensitive layer 116 are removed by a developer, such as tetramethyl ammonium hydroxide (TMAH). In one example, the developer includes a TMAH solution with a proper concentration, such as about 2.38%. However, negative-tone photosensitive layer and/or negative-tone developer may be alternatively used. After the developing, the patterned photosensitive layer 116 may proceed to other processing steps, such as a hard-baking process. The exposing process using the photomask and the photolithography apparatus may be implemented or replaced by other proper technique such as maskless photolithography, electron-beam writing, and ion-beam writing.

Figure 4:
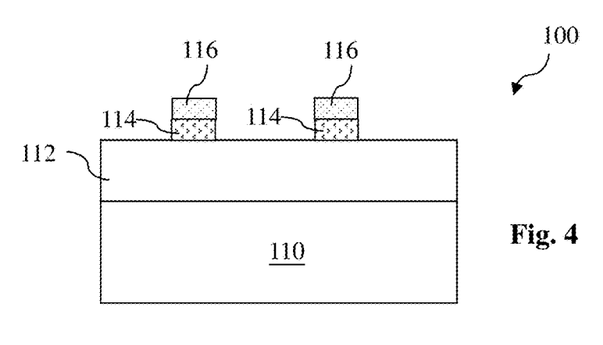

Referring to FIG. 4, an etching process is applied to the middle layer 114 using the patterned photosensitive layer 116 as an etch mask, thereby transferring the pattern from the patterned photosensitive layer 116 to the middle layer 114. In various embodiments, the first etching process may include dry etching, wet etching or a combination thereof. In the present example, the etching process includes a plasma etching process using an etchant having fluorine, such as $CF_2$, $CF_3$, $CF_4$, $C_2F_2$, $C_2F_3$, $C_3F_4$, $C_4F_4$, $C_4F_6$, $C_5F_6$, $C_6F_6$, $C_6F_8$, or a combination thereof.

Figure 5:
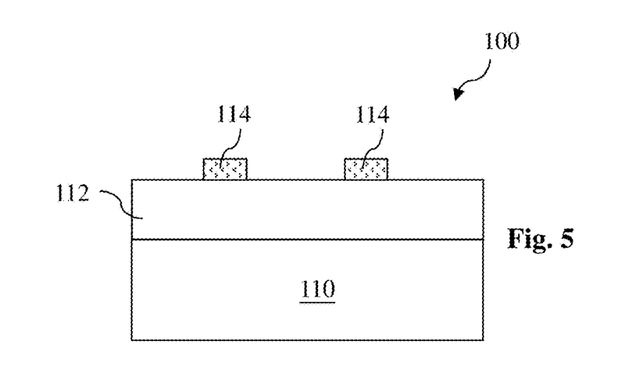

Referring to FIG. 5, the photosensitive layer 116 may be removed by a proper technique, such as wet stripping or plasma ashing, after the middle layer 114 is patterned by the respective etching process.

Figure 6:
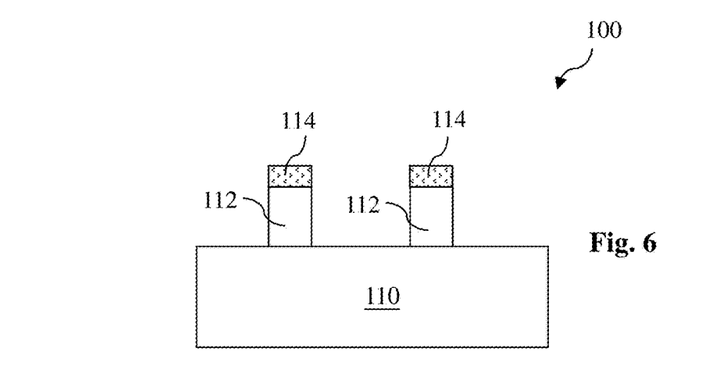

Referring to FIG. 6, a second etching process is applied to the under layer 112 using the patterned middle layer 114 as an etch mask, thereby transferring the pattern from the patterned middle layer 114 to the under layer 112. In various embodiments, the second etching process may include dry etching, wet etching or a combination thereof, with an etchant selectively etching the under layer 112 while the middle layer 114 substantially survives. Since the middle layer 114 is a silicon rich material while the under layer 112 is a carbon rich material in the present embodiment, the etch selectivity can be achieved through proper choice of the etchant. In the present embodiment, the second etching process includes a plasma etching process using an etchant having a sulfur-containing gas and an oxygen-containing gas. In one example, the oxygen-containing gas includes oxygen ($O_2$). In one example, the sulfur-containing gas includes carbonyl sulfide (COS). In another example, the sulfur-containing gas includes sulfur dioxide ($SO_2$).

Figure 7:
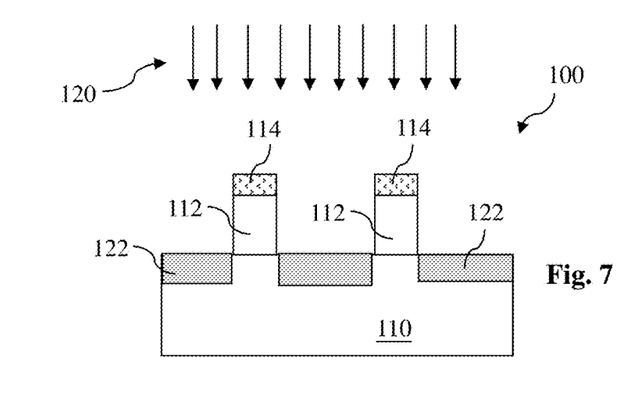

Referring to FIG. 7, a fabrication process is applied to the semiconductor structure 100, such as to a top material layer through the openings of the patterned under layer 112 using the under layer 112 as a mask. In some embodiments, an etching process is applied to the top material layer of the semiconductor substrate 110 using the under layer 112 as an etch mask. In some other embodiments, an ion implantation process 120 is applied to the semiconductor substrate 110 using the under layer as an implantation mask, thereby forming various doped features 122, such as doped wells, in the semiconductor substrate 110. In furtherance of the embodiments, a dielectric material layer, such as silicon oxide, may be interposed between the semiconductor substrate 110 and the under layer 112 as an ion implantation screening layer to enhance the implantation quality, such as reducing the channeling effect during the ion implantation process 120.

Figure 8:
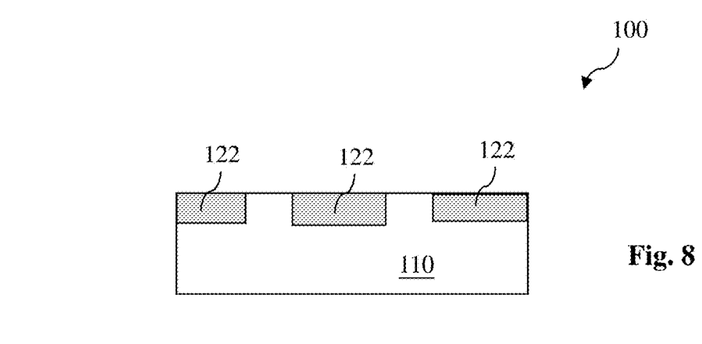

Referring to FIG. 8, the middle layer 114 and the under layer 112 are thereafter removed by applying a wet cleaning process. In some embodiments, the wet cleaning process includes applying a solution formed by mixing TMAH with a solvent, such as propylene glycol ethyl ether (PGEE) or PGEE with water. In the present example, the solution has a pH value greater than a pH value of the middle layer, which dissolves hardened silicon-containing material. In some embodiments, the wet cleaning process includes applying sulfuric peroxide mixture (SPM) and applying ammonia peroxide mixture (APM). SPM includes a solution having sulfuric acid ($H_2SO_4$) and hydrogen peroxide ($H_2O_2$). APM includes a solution having ammonium hydroxide (NH4OH), hydrogen peroxide ($H_2O_2$) and water ($H_2O$). The SPM and APM are applied to the semiconductor structure 100 sequentially in either order according to various embodiments. In other embodiments, the wet chemical process further includes applying a diluted hydrofluoric acid (DHF) to the semiconductor structure 100.

Figure 14:
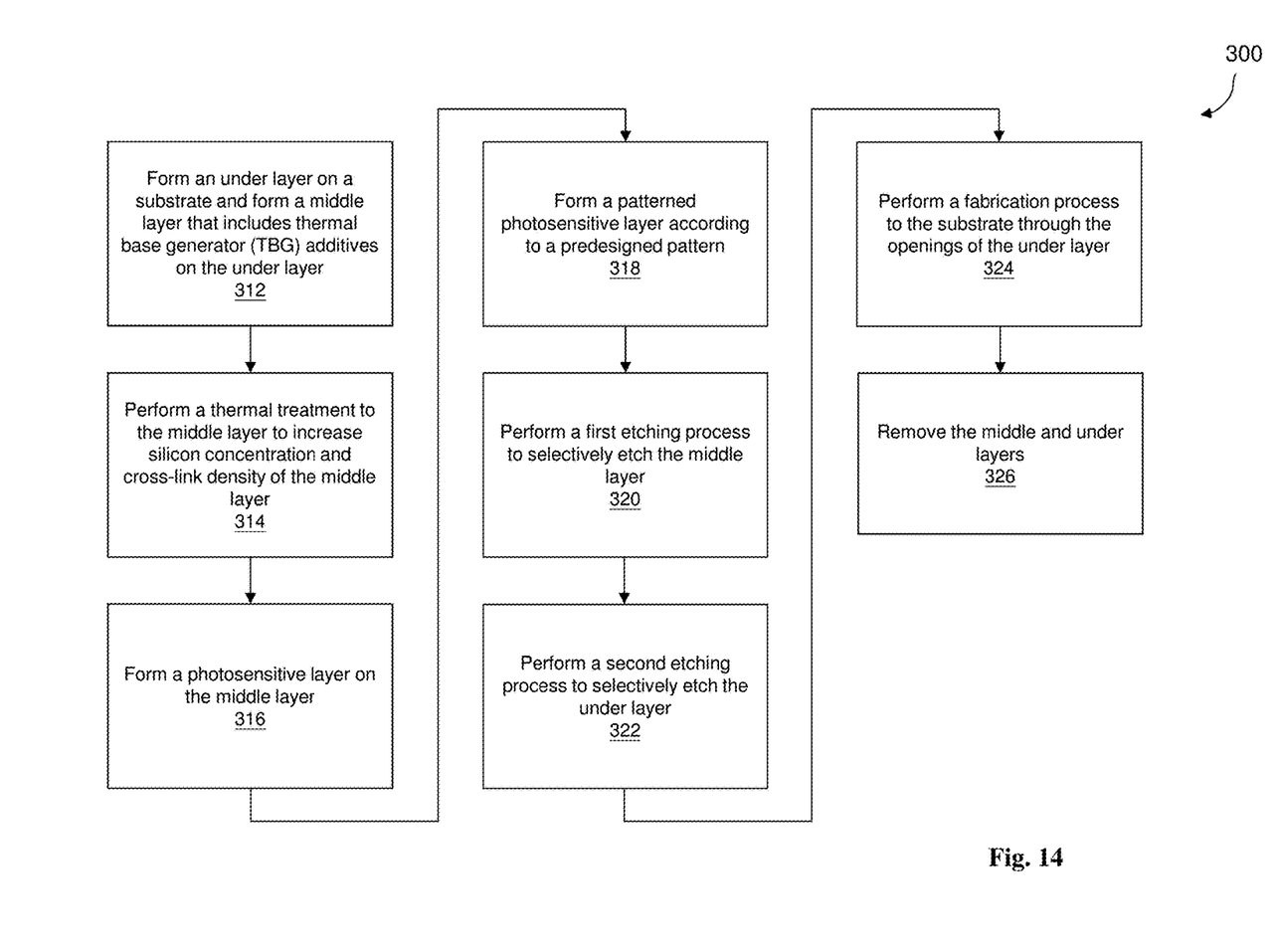
FIG. 14 is a flowchart of a method for a photolithography process using a tri-layer resist, according to aspects of the present disclosure in one embodiment.

FIG. 14 is a flowchart showing an illustrative method 300 for forming a tri-layer resist to pattern a workpiece, such as the semiconductor structure 100, constructed in accordance with some embodiments. The method 300 includes an operation 312 by forming an under layer 112 and a middle layer 114. Particularly, the operation 312 further includes forming a under layer 112 on a substrate 110 and a middle layer 114 on the under layer 112. In some embodiments, the substrate 110 is a semiconductor substrate, such as a silicon substrate. In some embodiments, the under layer 112 is designed to provide resistance to etching and/or ion implantation. The under layer 112 functions as a mask to protects the substrate 110 from etching and/or ion implantation. In some embodiments, the under layer 112 includes an organic polymer and is free of silicon. In some embodiments, after applying the material for the under layer 112, a CMP process may be performed to substantially planarize the surface of the under layer 112.

In the present embodiment, the middle layer 114 is a silicon-containing layer designed to provide etch selectivity from the under layer 112. In furtherance of the embodiment, the middle layer 114 functions as an etch mask to transfer a pattern to the under layer 112. The silicon-containing middle layer 114 and the silicon-free under layer 112 are designed to have etching selectivity from each other. In some embodiments, the formation of the middle layer 114 includes spin-on coating and a thermal treatment process with a suitable baking temperature. In the present embodiment, the middle layer 114 is designed to include TBG additives and silicon-containing monomers that each provides multiple cross-linking sites.

The method 300 includes an operation 314 by performing a thermal treatment to the middle layer 114. Particularly, the thermal treatment increases silicon concentration and cross-link density of the middle layer 114. In some embodiments, the thermal treatment is a baking process. The baking process decomposes TBG additives and release base. The released base facilitates cross-linking actions among monomers and increase silicon concentration in the middle layer 114. In some embodiments, TBG additives have molecular weight less than 300 g/mol. Particularly, TBG additives have chemical structures as illustrated in FIG. 13. Residuals of TBG additives during the baking process will evaporate from the middle layer 114. Additionally, the baking process can comprise two heating steps. The first heating step uses a heating temperature higher than the triggering point of TBG additives decomposition, while the second heating step uses a heating temperature higher than the heating temperature used in the first heating step and also higher than a boiling point of TBG residuals. The TBG residuals will evaporate and leaves the middle layer 114 during the second heating step. After the thermal treatment, the density and silicon concentration of the middle layer 114 is increased, and the etch selectivity to the under layer 112 is enhanced.

The method 300 includes an operation 316 by forming a photosensitive layer 116 on the middle layer 114. The photoresist layer 116 is photosensitive and is patterned by a photolithography process. The photoresist layer 116 is disposed on the middle layer 114 by a procedure that includes spin-on coating and baking process.

The method 300 includes an operation 318 by forming a patterned photoresist layer 116 according to a predefined circuit pattern, such as a circuit layout, using a photolithography process. In some embodiments, the photolithography process in the operation 318 includes an exposing process and a developing process applied to the photosensitive layer 116, thereby forming a patterned photosensitive layer 116. The exposing process utilizes a photolithographic technique with proper radiation source and corresponding radiation energy, such as DUV or EUV. During the exposing process, the photosensitive layer 116 is exposed to radiation energy through a photomask having a predefined pattern, resulting in a latent photoresist pattern. The photosensitive layer 116 within the exposed regions is chemically changed such that the exposed portions are removed during the developing process or alternatively the unexposed portions are removed during the developing process, depending on the type of the photosensitive layer 116 and the type of the developer. In some embodiments, the developing process is designed to remove the portions (the exposed or unexposed) of the photoresist layer by the developer in a proper mode, such as spraying or immersion.

The formation of the patterned photosensitive layer 116 may further include other processing steps, such as a post-exposure-baking (PEB) after the exposing process and/or a hard baking process after the developing process. The exposing process may be alternatively replaced by other proper technique such as maskless photolithography, electron-beam writing, ion-beam writing, or molecular imprint.

The method 300 includes an operation 320 by performing a first etching process to selectively etch the middle layer 114, thereby transferring the circuit pattern from the patterned photoresist layer 116 to the middle layer 114. The first etching process is applied to the middle layer 114 using the patterned photoresist layer 116 as an etch mask. In various embodiments, the first etching process may include dry etching, wet etching or a combination. In the present example, the first etching process includes a plasma etching process using an etchant having fluorine, such as $CF_2$, $CF_3$, $CF_4$, $C_2F_2$, $C_2F_3$, $C_3F_4$, $C_4F_4$, $C_4F_6$, $C_5F_6$, $C_6F_6$, $C_6F_8$, or a combination thereof. After the operation 316, the photoresist layer 116 may be removed by a proper technique, such as wet stripping or plasma ashing.

The method 300 includes an operation 322 by performing a second etching process to selectively etch the under layer 112, thereby transferring the circuit pattern from the patterned middle layer 114 to the under layer 112. The second etching process is applied to the under layer 112 using the patterned middle layer 114 as an etch mask. In various embodiments, the second etching process may include dry etching, wet etching or a combination. In one example, the second etching process includes a plasma etching process using an etchant having carbonyl sulfide (COS) and oxygen ($O_2$). In another example, the second etching process includes a plasma etching process using an etchant having sulfur dioxide ($SO_2$) and oxygen ($O_2$).

The method 300 includes an operation 324 by performing a fabrication process to the workpiece using the patterned under layer 112 as a mask such that the fabrication process is only applied to the portions of the workpiece within the openings of the under layer 112 while other portions of the workpiece covered by the under layer 112 is protected from being impacted by the fabrication process. In some embodiments, the fabrication process includes an etching process applied to the top material layer of the semiconductor substrate 110 using the under layer 112 as an etch mask. In some embodiments, the fabrication process includes an ion implantation process applied to the semiconductor substrate 110 using the under layer as an implantation mask, thereby forming various doped features in the semiconductor substrate 110.

The method 300 includes an operation 326 by removing the middle layer 114 and the under layer 112. After the operation 350, the middle layer 114 and the under layer 112 are removed by a wet chemical process using wet chemicals. In some embodiments, the wet cleaning process includes applying a solution formed by mixing TMAH with a solvent, such as propylene glycol ethyl ether (PGEE) or PGEE with water. In the present example, the solution has a pH value greater than a pH value of the middle layer, which dissolves hardened silicon-containing material. In some embodiments, the wet chemical process includes applying sulfuric peroxide mixture (SPM) and applying ammonia peroxide mixture (APM). SPM includes a solution having sulfuric acid ($H_2SO_4$) and hydrogen peroxide ($H_2O_2$). APM includes a solution having ammonium hydroxide ($NH_4OH$), hydrogen peroxide ($H_2O_2$) and water ($H_2O$). The SPM and APM are applied to the workpiece sequentially in either order according to various embodiments. In other embodiments, the wet chemical process further includes applying a diluted hydrofluoric acid (DHF) to the workpiece.

The present disclosure provides a lithography method and a silicon-containing middle layer used in the tri-layer photolithography technology. Monomers with multiple cross-linking sites are used in polymerization process. TBG additives decompose and create base environment under proper thermal treatment, which enhances cross-linking efficiency and increase silicon concentration of the middle layer. In various embodiments, the carbon-rich TBG residuals after decomposition are driven out of the middle layer, resulting in higher silicon weight percentage that increases etching selectivity. In some embodiments, the silicon-containing middle layer includes silicon more than 50% in weight percentage.

A lithography method is provided in accordance with some embodiments. The lithography method includes forming an under layer on a substrate; forming a silicon-containing middle layer on the under layer, wherein the silicon-containing middle layer has a thermal base generator (TBG) composite; forming a photosensitive layer on the silicon-containing middle layer; performing an exposing process to the photosensitive layer; and developing the photosensitive layer, thereby forming a patterned photosensitive layer.

A method for lithography patterning is provided in accordance with some embodiments. The method for lithography patterning includes forming an under layer on a substrate, wherein the under layer is carbon rich; forming a middle material on the bottom layer, wherein the middle material includes silicon-containing monomers and thermal base generator (TBG) additive; performing a heating process to the middle material, thereby forming a middle layer containing siloxane polymers, wherein the middle layer is free of TBG additive; forming a photosensitive layer on the middle layer; and developing the photosensitive layer, thereby forming a patterned photosensitive layer.

A method for lithography patterning is provided in accordance with some embodiments. The method for lithography patterning includes coating a bottom layer on a substrate, wherein the bottom layer contains carbon; coating a resin solution on the bottom layer, wherein the resin solution includes a thermal base generator (TBG) composite and monomers that contain silicon; baking the resin solution to increase both silicon concentration and material density of the resin solution, thereby forming a middle layer, wherein during the baking of the resin solution the TBG composite evaporates from the resin solution after releasing a base; forming a patterned photosensitive layer on the middle layer; performing a first etching process to transfer a pattern of the patterned photosensitive layer to the middle layer; performing a second etching process to transfer the pattern to the bottom layer; and performing a wet cleaning process to remove the middle layer and the bottom layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography method, comprising:
    forming an under layer on a substrate;
    forming a silicon-containing middle layer on the under layer, wherein the silicon-containing layer includes a type of monomers that each has four cross-linkable sides, and wherein the silicon-containing middle layer has a thermal base generator (TBG) composite that is capable of releasing a base;
    forming a photosensitive layer on the silicon-containing middle layer;
    performing an exposing process to the photosensitive layer; and
    developing the photosensitive layer, thereby forming a patterned photosensitive layer.

2. The method of claim 1, further comprising:
    performing a thermal treatment to the silicon-containing middle layer, wherein during the thermal treatment the TBG composite evaporates from the silicon-containing middle layer after releasing the base from the TBG composite.

3. The method of claim 2, wherein the thermal treatment is a baking process comprising a first baking step that heats the silicon-containing middle layer at a first temperature and a second baking step that heats the silicon-containing middle layer at a second temperature higher than the first temperature, and wherein the first temperature is higher than a triggering temperature for the TBG composite to release the base and the second temperature is higher than a boiling temperature of the TBG composite.

4. The method of claim 2, wherein a molecular weight of polymers in the silicon-containing middle layer is smaller than 5,000 g/mol before the thermal treatment and greater than 10,000 g/mol after the thermal treatment.

5. The method of claim 2, wherein the performing of the thermal treatment is in-situ with the forming of the silicon-containing middle layer.

6. The method of claim 1, wherein the TBG composite has a molecular weight of less than 300 g/mol.

7. The method of claim 6, wherein the TBG composite includes a chemical structure selected from a group of

8. The method of claim 1, wherein the TBG composite has a molecular weight of less than 200 g/mol.

9. The method of claim 8, wherein the TBG composite includes a chemical structure as 10. The method of claim 1, wherein a percentage of the type of monomers over a total number of monomers in the silicon-containing middle layer is greater than 40%.

11. The method of claim 1, wherein the silicon-containing middle layer includes siloxane polymer with a chemical structure as wherein O and Si represent oxygen and silicon, respectively;

a, b, and c represent weight percentages of X, R, and D groups, respectively;

X represents a first organic group that provides cross-linking sites;

R represents a second organic group that enhances etching resistance, adhesion of the photosensitive layer; and D represents an aromatic group designed to tune extinction coefficient and index of refraction.

12. The method of claim 1, further comprising:

performing a first etching process to transfer a pattern of the patterned photosensitive layer to the silicon-containing middle layer;

performing a second etching process to transfer the pattern to the under layer; and performing a wet cleaning process to remove the silicon-containing middle layer and the under layer, wherein the wet cleaning process includes applying a solution formed by mixing tetramethyl ammonium hydroxide (TMAH) with propylene glycol ethyl ether (PGEE), wherein the solution has a pH value greater than a pH value of the silicon-containing middle layer.

13. A method for lithography patterning, comprising:

forming an under layer on a substrate, wherein the under layer contains carbon;

forming a middle material on the under layer, wherein the middle material has a substantially uniform composition, and wherein the middle material includes silicon-containing monomers and a thermal base generator (TBG) additive;

performing a heating process to the middle material, wherein the heating process drives the TBG additive out of the middle material, thereby forming a middle layer containing siloxane polymers;

forming a photosensitive layer on the middle layer; and developing the photosensitive layer, thereby forming a patterned photosensitive layer.

14. The method of claim 13, wherein during the performing of the heating process, the TBG additive decomposes into a TBG residual and a base, wherein the TBG residual evaporate thereafter.

15. The method of claim 14, wherein after the performing of the heating process the middle material shrinks about 20% in volume.

16. The method of claim 14, wherein the TBG additive has a molecular weight of less than 300 g/mol.

17. The method of claim 14, wherein the performing of the heating process is in-situ with the forming of the middle material.

18. A method for lithography patterning, comprising:

coating a bottom layer on a substrate, wherein the bottom layer contains carbon;

coating a resin solution on the bottom layer, wherein the resin solution includes a thermal base generator (TBG) composite and monomers that contain silicon;

baking the resin solution to increase both silicon concentration and material density of the resin solution, thereby forming a middle layer, wherein during the baking of the resin solution the TBG composite evaporates from the resin solution after releasing a base, wherein the baking of the resin solution includes baking the resin solution to a first temperature to decompose the TBG composite and then baking the resin solution to a second temperature to evaporate the TBG composite, wherein the second temperature is higher than the first temperature;

forming a patterned photosensitive layer on the middle layer;

performing a first etching process to transfer a pattern of the patterned photosensitive layer to the middle layer;

performing a second etching process to transfer the pattern to the bottom layer; and performing a wet cleaning process to remove the middle layer and the bottom layer.

19. The method of claim 18, wherein the TBG composite has a chemical structure selected from a group of 20. The method of claim 18, wherein the TBG composite has a molecular weight of less than 300 g/mol.

* * * * *